US006911705B2

(12) United States Patent
Nishinohara

(10) Patent No.: US 6,911,705 B2
(45) Date of Patent: Jun. 28, 2005

(54) MISFET WHICH CONSTITUTES A SEMICONDUCTOR INTEGRATED CIRCUIT IMPROVED IN INTEGRATION

(75) Inventor: Kazumi Nishinohara, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/677,289

(22) Filed: Oct. 3, 2003

(65) Prior Publication Data
US 2005/0023567 A1 Feb. 3, 2005

(30) Foreign Application Priority Data

Jul. 31, 2003 (JP) ....................... 2003-283480

(51) Int. Cl.$^7$ ................... H01L 29/76; H01L 29/94; H01L 31/062; H01L 31/113; H01L 31/119
(52) U.S. Cl. .................. 257/397; 257/327; 257/347
(58) Field of Search ............. 257/327, 347, 257/397

(56) References Cited

U.S. PATENT DOCUMENTS

| | | | |
|---|---|---|---|
| 6,291,861 B1 | 9/2001 | Iwata et al. | |
| 6,784,491 B2 * | 8/2004 | Doyle et al. | 257/346 |
| 2004/0036126 A1 * | 2/2004 | Chau et al. | 257/401 |
| 2004/0262650 A1 * | 12/2004 | Iwata et al. | 257/288 |

FOREIGN PATENT DOCUMENTS

| JP | 5-166837 | 7/1993 |
|---|---|---|
| JP | 7-106574 | 4/1995 |
| JP | 10-70195 | 3/1998 |

OTHER PUBLICATIONS

Jun Yuan et al., "Source/Drain Parasitic Resistance Role and Electrical Coupling Effect in sub 50nm MOSFET Design", Proceedings of ESSDERC 2002, pp. 503–506, Sep. 2002.
Hyunin Lee et al., "Characteristics of MOSFET with Non–overlapped Source–Drain to Gate", IEICE Trans. Electron., vol. E85–C, No. 5, pp. 1079–1085, May 5, 2002.

* cited by examiner

*Primary Examiner*—Ngân V. Ngô
(74) *Attorney, Agent, or Firm*—Finnegan, Henderson, Farabow, Garrett & Dunner, L.L.P.

(57) ABSTRACT

There is disclosed a semiconductor device which comprises a semiconductor substrate, a pair of element isolating insulating films separately formed in the semiconductor substrate and defining an element region, a pair of impurity diffusion regions formed in the element regions and in contact with the element isolating insulating films, respectively, a channel region interposed between the pair of impurity diffusion regions, and a gate electrode formed via a gate insulating film on the channel region, the gate electrode being disposed away from end portions of the impurity diffusion regions. The gate length of the gate electrode is limited to 30 nm or less, the distance between the impurity diffusion regions and the edges of the gate electrode is respectively limited to 10 nm or less, and the distribution in lateral direction of impurity concentration in the impurity diffusion regions is limited to 1 digit/3 nm or more.

11 Claims, 5 Drawing Sheets

MISFET WHICH CONSTITUTES A SEMICONDUCTOR INTEGRATED CIRCUIT IMPROVED IN INTEGRATION

CROSS-REFERENCE TO RELATED APPLICATIONS

This application is based upon and claims the benefit of priority from the prior Japanese Patent Application No. 2003-283480, filed Jul. 31, 2003, the entire contents of which are incorporated herein by reference.

BACKGROUND OF THE INVENTION

1. Field of the Invention

The present invention relates to a semiconductor device and a method for manufacturing the semiconductor device. In particular, the present invention relates to a MISFET which constituting a semiconductor integrated circuit improved in integration.

2. Description of the Related Art

With a view to minimize the sub-threshold current and junction capacity in a complementary MOS (hereinafter referred to as CMOS) transistor, there has been proposed a CMOS transistor of offset gate structure. With this CMOS transistor, it is possible to realize a high speed operation with low power consumption.

Further, with a view to increase the ON current of a thin film transistor and to minimize the leak current thereof, there has been proposed to implant ions in an insulating film of an offset region to bury a negative charge, thus reversing the offset portion. It is also known that the $I_{on}/I_{off}$ ratio of a thin film transistor can be increased by regulating the magnitude of offset to the range of 100 to 200 $\mu$m.

In the meantime, it is also proposed to avoid the offset between the gate electrode and the source/drain impurity diffusion region in order to prevent any decrease of the $I_{on}$.

In recent years, there has been proposed, with a view to improve the sub-threshold characteristics, to regulate the distance of the offset region between the gate electrode and the impurity diffusion region to the range of 0 to 10 nm.

It is also reported, as a result of studies using a simulation which is aimed at promoting the miniaturization of semiconductor device, that when the impurity diffusion layer is formed of a box-like impurity distribution, it is possible to prevent the reduction of $I_{on}$ while suppressing any increase of $I_{off}$ even if the overlap region formed below the gate of so-called source/drain extension is eliminated therefrom.

In the semiconductor devices of recent years, the gate length thereof is getting shorter, e.g. 40 nm or less as the miniaturization of semiconductor device is further promoted in recent years. When the gate length is extremely short as described above, $I_{off}$ is caused to increase due to a strong short channel effect, and when it is tried to suppress this increase of $I_{off}$, $I_{on}$ is also caused to decrease. Any of the aforementioned offset gate structure and the structure where the source/drain are not overlapped with the gate are not suited for use in an extremely miniaturized MOSFET.

BRIEF SUMMARY OF THE INVENTION

The semiconductor device according to one embodiment of the present invention comprises:

a semiconductor substrate;

a pair of element isolating insulating films separately formed in the semiconductor substrate and defining an element region;

a pair of impurity diffusion regions formed in the element regions and in contact with the element isolating insulating films, respectively;

a channel region interposed between the pair of impurity diffusion regions; and a gate electrode having a gate length of 30 nm or less and formed via a gate insulating film on the channel region, the gate electrode being disposed away from end portions of the impurity diffusion regions, a distance between the impurity diffusion regions and the edges of the gate electrode being 10 nm or less, and the distribution in lateral direction of impurity concentration in the impurity diffusion regions being 1 digit/3 nm or more.

A method of manufacturing a semiconductor according to one embodiment of the present invention comprises:

separately forming a pair of element isolating insulating films to define an element region;

forming a gate electrode having a gate length of 30 nm or less via a gate insulating film on a channel region of the element region of semiconductor substrate;

forming an offset spacer on a sidewall of the gate electrode;

implanting an impurity into the semiconductor substrate with the offset spacer and the gate electrode being employed as a mask;

heat-treating the semiconductor substrate for a very short period of time to activate the impurity which has been introduced into the impurity diffusion region, the impurity which has been activated being substantially prevented from being introduced into a region below the gate electrode;

forming an interlayer insulating film over the entire top surface of the semiconductor substrate; and forming a contact hole in the interlayer insulating film, the contact hole being subsequently filled with a conductive material to form a wiring.

DETAILED DESCRIPTION OF THE INVENTION

Next, the embodiments of the present invention will be explained with reference to drawings.

Figure 1:
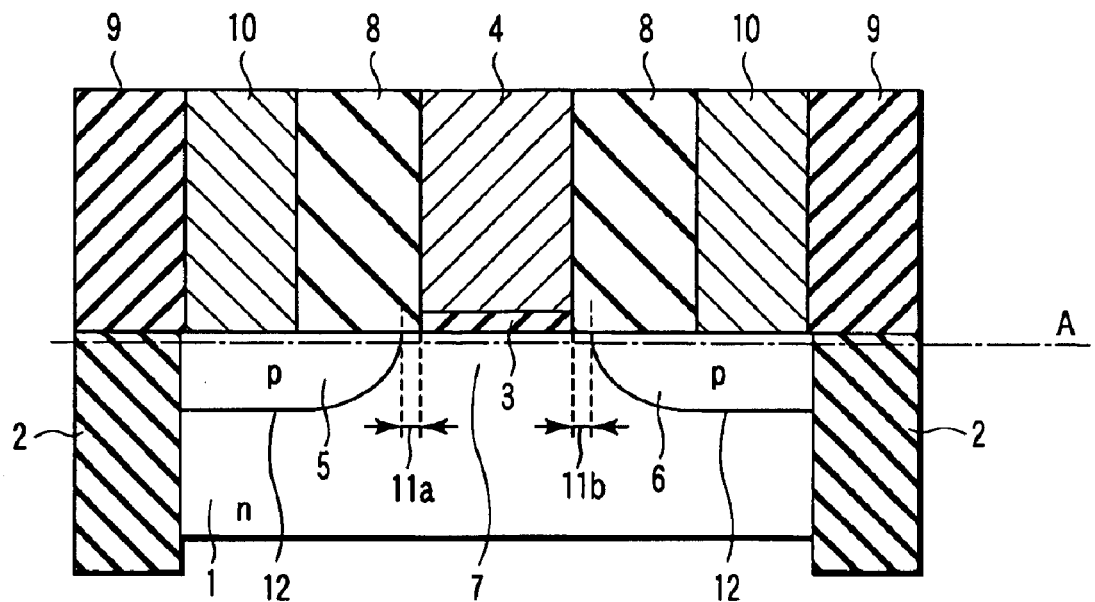
FIG. 1 is a cross-sectional view illustrating the structure of the semiconductor device according to one embodiment of the present invention.

FIG. 1 is a cross-sectional view illustrating the structure of the semiconductor device according to one embodiment of the present invention. As shown in FIG. 1, a source region 5 and a drain region 6 are separately formed as an impurity diffusion region in the element region of a semiconductor substrate 1 having an element isolating insulation film s2. In this case, the semiconductor substrate 1 is n-type, and a p-type impurity is implanted in the source region 5 and in the drain region 6. Incidentally, the semiconductor substrate 1 may be formed of a substrate of SOI (silicon on insulator) structure. A gate electrode 4 having a gate length of 20 nm is formed, via a gate insulating film 3 having a thickness of 1 nm (when reduced as a silicon oxide film), on the surface of a channel region interposed between the source region 5 and the drain region 6. The gate electrode 4 is provided on the sidewall thereof with a gate sidewall 8. The impurity diffusion regions such as the source region 5 and the drain region 6 are not overlapped with the gate electrode 4, and offset gate regions 11a and 11b are disposed between the end portions of the impurity diffusion regions and the sidewalls of the gate electrode 4. A region of the semiconductor substrate 1 which is located immediately below the gate electrode 4 is substantially free from the impurity of the source/drain regions. An interlayer insulating film 9 is formed on the semiconductor substrate 1, and a wiring 10 electrically connected with the impurity diffusion regions 5 and 6 is also formed on the semiconductor substrate 1.

In the semiconductor device according to this embodiment of the present invention, the offset gate regions 11a and 11b disposed between the gate electrode 4 and the impurity diffusion regions 5 and 6 respectively have a length which is limited to 10 nm or less. Further, the distribution in lateral direction of impurity concentration in the source region 5 and the drain region 6 is as sharp as 1 digit/3 nm or more. Incidentally, the boundaries 12 of the impurity diffusion regions 5 and 6 in FIG. 1 are located at a region where impurity concentration is $1 \times 10^{18}$ cm$^{-3}$.

Next, the effects of the offset gate regions 11a and 11b on the electric characteristics of MOSFET will be explained with reference to FIG. 2.

Figure 2:
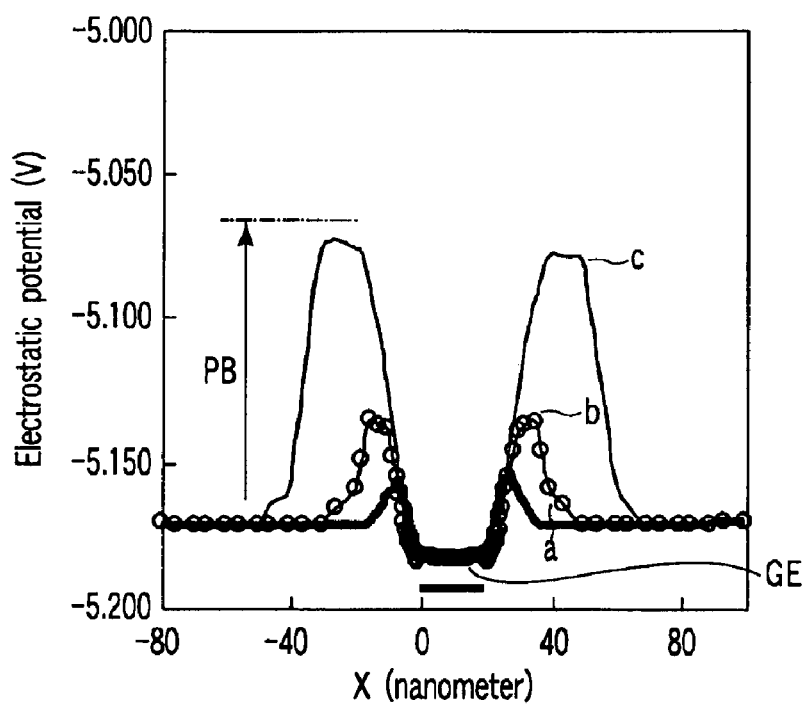
FIG. 2 is a graph showing the results of the simulation of electrostatic potential.

FIG. 2 illustrates the results obtained, as the electrostatic potential at the surface of the channel region 7 was determined based on the simulation of device. In this case, the distribution of potential at the surface "A" in FIG. 1 was determined by applying 0V to the source region 5, the drain region 6 and the semiconductor substrate 1, and applying a source voltage of −0.85V to the gate electrode 4. This surface "A" was located at a depth of 2 nm as measured from the surface of the substrate and the operation temperature was set to 300K.

Incidentally, the length of the offset gate regions 11a and 11b was varied to 4 nm, 14 nm and 24 nm to simulate three MOSFETs, each of which is indicated as curves "a", "b" and "c", respectively, in the graph of FIG. 2.

"GE" in FIG. 2 corresponds to the position of the gate electrode 4. As shown by the curve "c", when the length of the gate offset is 24 nm, a potential barrier PB of about 0.1V was caused to generate between the surface of the channel region 7 located below the gate electrode 4 and the source region 5. Since the substrate surface falling within the offset gate region 11a was an n-type region, the potential barrier PB was caused to generate due to an inner potential of the junction between the aforementioned substrate surface and the p-type region of the source region 5.

Since a gate voltage was being applied to the gate electrode 4, the potential of the surface of the channel region located below the gate electrode 4 was caused to decrease, thereby a potential barrier generates on both sides of the channel region 7. The graph of FIG. 2 shows that as the offset gate regions 11a and 11b became shorter, the potential barrier PB was enabled to become lower. When the length of the offset region was 4 nm, the potential barrier PB became about 0.01V as shown by the curve "a". In this case, the magnitude of the potential barrier PB is smaller as compared with the thermal energy 0.026V at 300K. Further, since the thickness of the gate insulating film was made as thin as 1 nm (when reduced as a silicon oxide film), it was possible, due to the effect of the electric field of the gate, to sufficiently induce minority carrier even in the offset region. As a result, when a minute bias is applied to the drain region, a drain current flows depending on the drain bias without necessitating the offset voltage.

In the simulation shown in FIG. 2, the depth of the source region 5 and the drain region 6 both constituting an impurity diffusion region was 12 nm. Even when the depth of the impurity diffusion region was 30 nm, it was confirmed possible to make the potential barrier smaller than thermal energy by providing an offset gate region having a length of about 3 nm. Furthermore, it was confirmed that even when the offset gate region was made longer, the potential barrier could be made smaller by decreasing the impurity concentration of the channel.

However, when the depth of the impurity diffusion region was increased over about 30 nm, the potential barrier to be induced by the gate offset tends to become larger than the thermal energy. The distribution of impurity in a deep diffusion region was not sharp but gradually changed. Therefore, the depletion layer extends deep into the interior of the end portion of the source region 5, thereby causing the potential barrier induced by the inner potential of junction to distribute extensively into the interior of the source region. Accordingly, in the case of the offset gate structure provided with a gate offset of several nanometers, the potential barrier is enabled to become lower than the thermal energy. This phenomenon is peculiar to the MOSFET employing a source/drain region having a high impurity concentration and a shallow junction. It has been discovered by the present inventors that if the characteristics of the aforementioned structure are to be optimized, it is necessary to adopt the influence of the thermal agitation. The present invention has been accomplished based on such findings. Incidentally, the influence of the thermal agitation was not taken into consideration in the optimization of the conventional structure.

Figure 3:
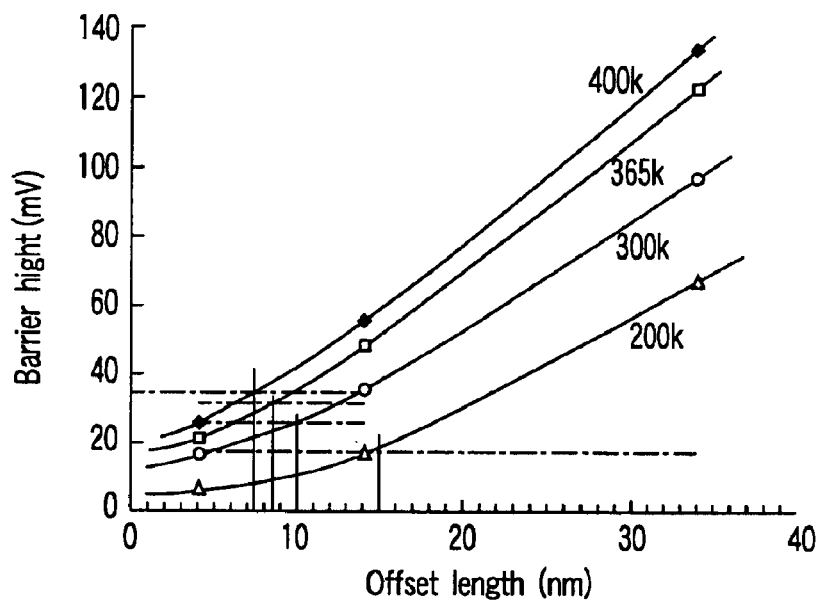
FIG. 3 is a graph illustrating the relationship between the length of gate offset and the height of potential barrier.

The graph of FIG. 3 illustrates the relationships between the length of the gate offset and the height of the potential barrier. In this graph, the results are shown with respect to four operation temperatures (200K, 300K, 365K and 400K).

As shown in FIG. 3, when the operation temperature was 300K, the height of the potential barrier was lower than the thermal energy under a condition where the length of the gate offset was about 10 nm or less. In this case, the carrier was enabled to go across this low potential barrier owing to a minute drain bias, thereby electric current flows without necessitating the offset bias. When the operation temperature was 200K also, the height of the potential barrier was lower than the thermal energy under a condition where the length of the gate offset was about 14 nm or less. Therefore, electric current flows without necessitating the offset bias under a condition where the length of the gate offset was about 14 nm or less. Further, when the operation temperature was 400K, the height of the potential barrier was lower than the thermal energy under a condition where the length of the gate offset was about 7 nm or less. Therefore, electric current flows without necessitating the offset bias under a condition where the length of the gate offset was about 7 nm or less. Namely, the length of the gate offset can be optionally selected depending on the operation temperature. In this embodiment, the operation temperature of 300K was employed as a standard and the length of gate offset was set to 10 nm or less. To obtain a higher driving power, it is desirable to confine the length of the offset gate regions 11a and 11b to about 3 nm or less.

Figure 4:
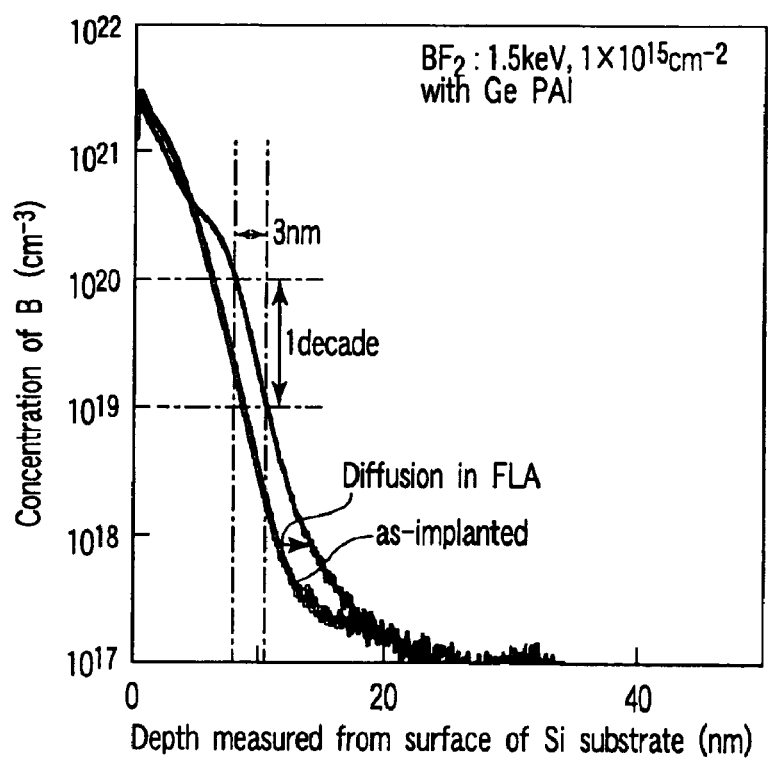
FIG. 4 is a graph showing a distribution of impurity concentration in the substrate of the semiconductor device according to one embodiment of the present invention.

In the semiconductor device according to this embodiment, the distribution in lateral direction of impurity concentration in the source region 5 and the drain region 6 is sharp. More specifically, the distribution in lateral direction of impurity concentration is 10 digit/3 nm or more. The graph of FIG. 4 shows the results measured of the impurity concentration in depth-wise direction. The impurity concentration at the end portion 12 of the diffusion regions contacting with the offset gate regions 11a and 11b is $1 \times 10^{18}$ cm$^{-3}$. When the depth decreases by a distance of 3 nm or so, the impurity concentration increases up to $1 \times 10^{19}$ cm$^{-3}$. Further, when the depth is less than 3 nm, the impurity concentration increases up to as high as $1 \times 10^{20}$ cm$^{-3}$ or more. As a result, it is possible to reduce the electric resistance of the impurity diffusion region, which is disposed below the gate sidewall 8. When the electric resistance of this impurity diffusion region is reduced by using the source/drain regions which are high in impurity concentration and sharp in impurity distribution, a drain region of high impurity concentration is exists in the vicinity of the channel region, thereby making it possible to enhance the influence of drain bias on the channel region, to weaken the controllability of the gate and to prominently increase the effects of short channel. On this occasion, in contrast to the MOSFET where the channel length is relatively large and hence the effects of short channel are weakened, it is more advisable to offset the source/drain relative to the gate to reduce the effects of short channel, thus making it possible to enhance the channel current controllability by the gate and to obtain a high driving power. The distribution in lateral direction of impurity diffusion regions should more preferably be 1 digit/2.5 nm or more, most preferably 1 digit/2 nm or more.

As described above, in this embodiment of the present invention, the source region 5 as well as the drain region 6 to be formed are offset from the sidewall of the gate electrode 4 by using the diffusion region having a sharp impurity distribution. As a result, it is possible to realize an offset gate structure without offset bias, to minimize the parasitic resistance of a region below the sidewall of gate, and to obtain a high driving power.

Figure 5:
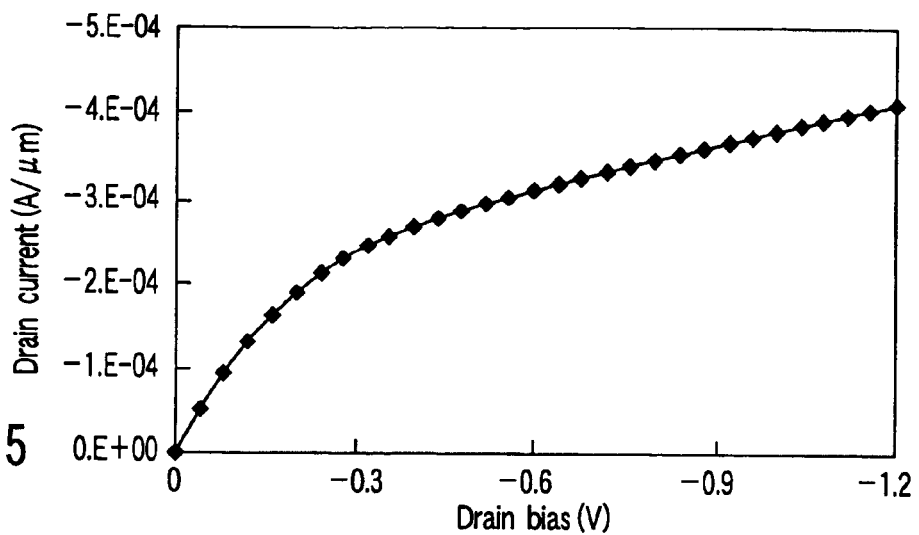
FIG. 5 is a graph showing the results of the simulation of drain current-drain voltage.

The graph of FIG. 5 shows the results of the simulation of drain current-drain voltage where the length of the gate offset is set to 3 nm. In this case, the offset voltage is not generated and a high driving power is obtained.

As explained above, in the case of this embodiment, the offset gate region to be formed in a minute MOSFET having a gate length of 30 nm or less is designed to have a length of 10 nm or less. As a result, it is possible to make the potential barrier to be derived from the gate offset smaller than the thermal energy, thereby making it possible to realize a structure, which is free from the generation of offset voltage. At the same time, it is now possible to dispose the source/drain regions away from the channel region by the provision of the offset gate region, thus suppressing the effects of short channel. It is now possible in this manner to improve the subthreshold characteristics and to minimize the off-leak current. Moreover, since the impurity concentration is sharply changed in the lateral direction in the source/drain regions, it is now possible to minimize the parasitic resistance of a region below the sidewall of gate and to obtain a high driving power.

In the case of this embodiment, the depth of the source/drain regions should preferably be as shallow as 16 nm or less, more preferably 10 nm or less. If the depth of the source/drain regions is larger than 16 nm, it would become difficult to distribute an impurity with such a sharp change in impurity concentration, as described above. Further, the sheet resistance in the impurity diffusion region should preferably be less than 1 kΩ/□, more preferably less than 0.7 kΩ/□. When the sheet resistance is higher than 1 kΩ/□, the driving power would be considerably deteriorated due to the parasitic resistance of the source/drain regions.

Further, in the channel region, the impurity concentration thereof decreases gradually toward the surface thereof, wherein the impurity concentration of the channel region at the surface of substrate should preferably be less than $2 \times 10^{18}$ cm$^{-3}$. When the impurity concentration of the channel region is sufficiently reduced, the channel mobility can be enhanced and at the same time, the potential barrier of the offset region can be lowered. Further, even if the channel length is substantially elongated due to the provision of the offset region, the channel resistance can be suppressed due to a high mobility of the channel region. As a result, it is now possible to minimize the S factor through the provision of the offset region and to secure a high current driving power while maintaining the $I_{off}$ at a low level. The impurity concentration of the channel region at the surface thereof should more preferably be less than $5 \times 10^{17}$ cm$^{-3}$. In this case, the non-uniformity in characteristics among the transistors within a chip can be remarkably minimized. Incidentally, it is most preferable that the surface of the channel region be free from impurities. In particular, since the impurity existing in the vicinity of the surface of the channel region greatly affects the non-uniformity of characteristics of transistor, it is most preferable that the impurity does not exist in the region extended from the surface of the channel to a depth of 5 nm.

Figure 6A:
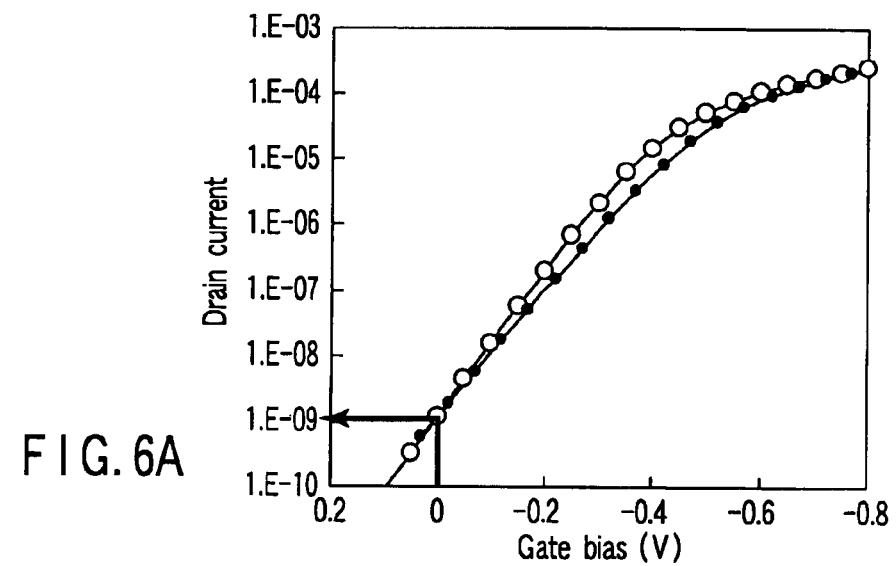
FIGS. 6A and 6B show a graph showing the results of the simulation wherein the drain current-gate voltage characteristics of a structure comprising a gate offset are compared with that of a structure comprising no gate offset.
Figure 6B:
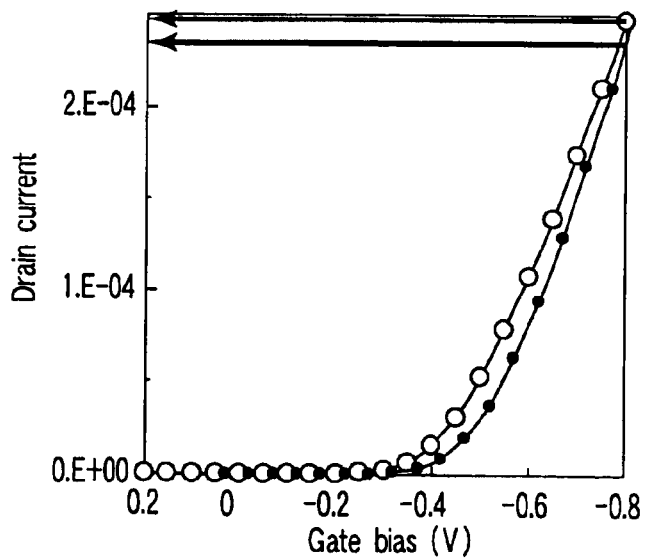

FIGS. 6A and 6B show the results of the simulation indicating the effects of the present invention. The conditions therein were 20 nm in gate length, $1 \times 10^{17}$ cm$^{-3}$ in concentration of impurity in a region extending from the surface of the channel to a depth of 5 nm, and $5 \times 10^{18}$ cm$^{-3}$ in concentration of impurity in a deep region extending deeper than 5 nm. The arrow in FIG. 6A represents $I_{off}$ and the arrow in FIG. 6B represents $I_{on}$. The line attached with white circles in these FIGS. illustrates a transistor having an offset region of 2.5 nm, while the line attached with black circles in these FIGS. illustrates a transistor having no offset region and hence having a gate electrode and source/drain regions, which are overlapped with each other by a distance of 2.5 nm.

By using a metal gate, the work function of the gate electrode in each of the transistors is adjusted so as to enable both of the transistors to have the same $I_{off}$ value. FIG. 6A shows the identity of the $I_{off}$ value. As seen from FIG. 6B, the transistor having the offset region was higher in driving power as compared with the transistor having no offset region. Without necessitating the adjustment of the work function of the gate electrode, the $I_{off}$ value in both transistors can be made identical with each other by using a polysilicon gate electrode using a high concentration of boron and by changing the value of impurity concentration of the surface of the channel region. In particular, if the $I_{off}$ value is to be made identical with each other by changing the impurity concentration of the channel surface, the value of $I_{off}$ would become higher due to strong effects of short channel in the case of the aforementioned overlapped structure. To suppress this phenomenon, it is required to employ a channel of high impurity concentration. For example, when the gate length is 20 nm, the impurity concentration of the surface of channel is required to rise above $5 \times 10^{18}$ cm$^{-3}$. In this case, although it is possible, in the case of the overlapped structure, to suppress the effects of short channel, the mobility of the channel is caused to deteriorate due to the impurity, and moreover, the driving power is also caused to deteriorate. In the case of a structure provided with the offset region however, it is possible to control the value of $I_{off}$ to a low level and to maintain a low impurity concentration of the channel surface, thereby making it possible to maintain a high driving power as shown in FIG. 6B. It has been confirmed through a simulation that when the offset region is provided in this manner, the value of $I_{off}$ can be suppressed and the driving power can be increased.

In the foregoing description, the present invention has been explained with reference to p-MOSFET. However, the embodiment of the present invention can be applied to n-MOSFET by inverting the polarity of impurity and voltage. The gate electrodes of the n-MOSFET and p-MOSFET may be constructed respectively using different metals, metal compounds or a laminate film comprising any of these metals and metal compounds to control the work function thereof, thereby making it possible to apply a dual gate structure to a transistor. As for the metal gate, it is possible, for constructing the portion thereof contacting with the gate insulating film, to employ at least one compound selected from the group consisting of nitrides, carbon nitrides, silicides and silicon nitrides of at least one transition metals of IV Group, V Group and VI Group elements. More specifically, the portion of the metal gate contacting with the gate insulating film may be constituted by at least one compound selected from Ni silicide, W nitride, Mo nitride, Ta nitride, Ti nitride, W silicon nitride, Mo silicon nitride, Ta silicon nitride, Ti silicon nitride, Ti carbon nitride, W carbon nitride, Mo carbon nitride and Ta carbon nitride. Alternatively, it is possible to employ any of these compounds into which an impurity has been introduced. Otherwise, it is possible to employ at least one compound selected from Ru containing oxygen, Ru containing nitrogen and RuO$_2$ containing nitrogen for forming the portion of the metal gate contacting with the gate insulating film. In any case, it is possible to obtain a high-performance CMOS. As described above, it is possible, through the employment of the MISET structure of this embodiment, to realize an integrated circuit of high performance and low power consumption.

Next, the method of manufacturing a semiconductor device according to one embodiment of the present invention will be explained with reference to FIGS. 7 to 11.

Figure 7:
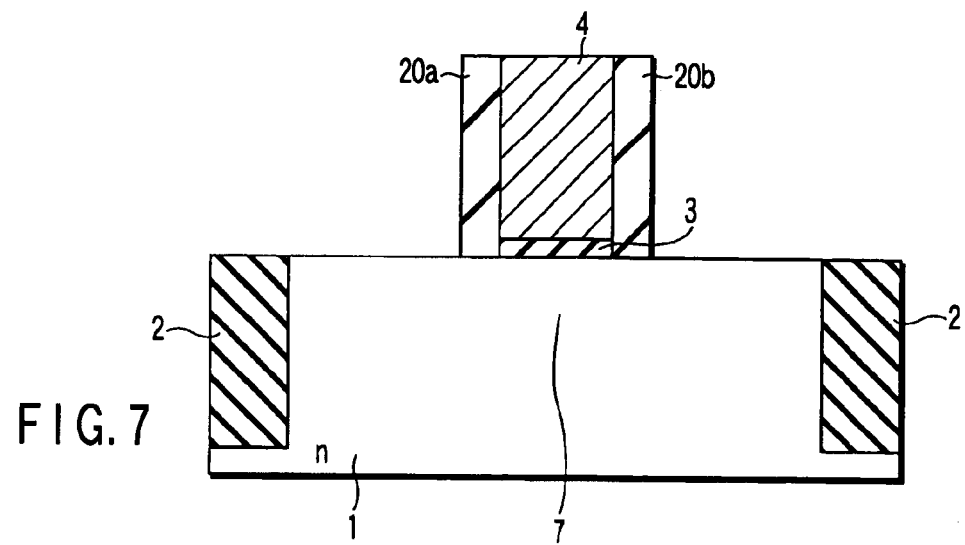
FIG. 7 is a cross-sectional view illustrating a step of manufacturing a semiconductor device according to one embodiment of the present invention.

First of all, as shown in FIG. 7, an element isolation region 2 is formed in a semiconductor substrate 1 according to the conventional method. After finishing the formation of a sacrificial oxide film having a thickness of about 5 nm on the surface of substrate, a channel impurity (not shown) for adjusting the threshold voltage is ion-implanted into the surface of substrate. After the sacrificial oxide film has been peeled away, a gate insulating film 3 having a thickness of 1 nm (thickness of effective oxide film) is formed on the surface of substrate. As for this insulating film, it is preferable to employ silicon oxide, silicon nitride having a dielectric constant, which is higher than that of silicon oxide, Ta$_2$O$_5$, TiO$_2$, (Br,Sr)TiO$_3$, HfO$_2$, ZrO$_2$ or oxides containing any one of these compounds and Si. Then, by lithography, a gate electrode 4 is formed. This gate electrode 4 may be formed using doped polysilicon. Subsequently, TEOS (tetraethoxy silane) film was deposited over the entire top surface of the substrate, and then, by sidewall-leaving method employing anisotropic etching, offset spacers 20a and 20b are formed.

As for the thickness of the offset spacers 20a and 20b, although it is optionally selected, as long as the thickness thereof is selected from the range of 5 to 10 nm, it is possible to obtain the effects of the offset spacer. Further, the offset spacers 20a and 20b may be formed using a silicon nitride film, a silicon oxide film, or a laminate comprising any of these films and a TEOS film instead of using a single TEOS film.

Figure 8:
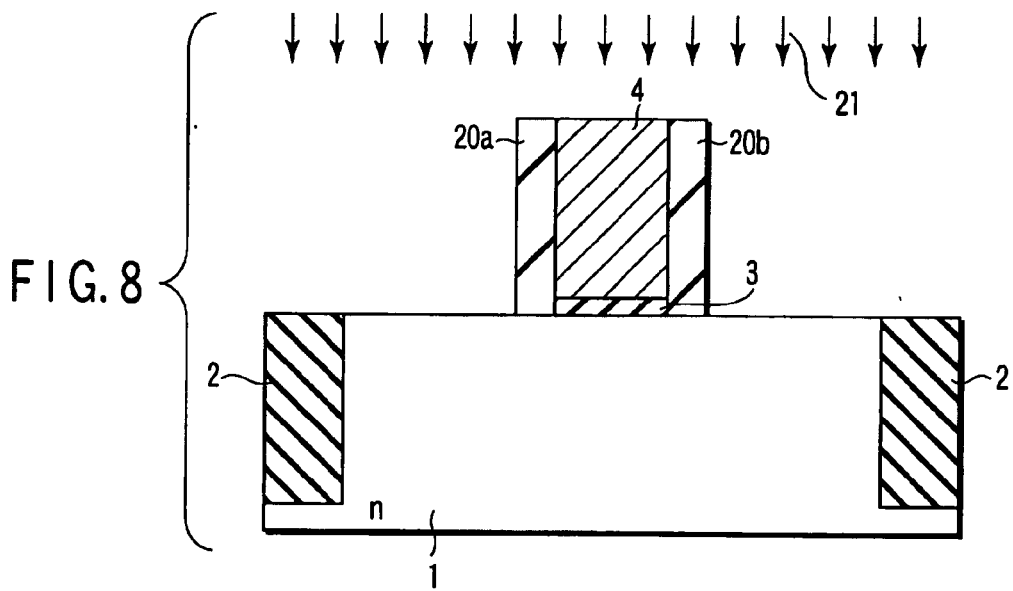
FIG. 8 is a cross-sectional view illustrating a manufacturing step performed subsequent to the step of FIG. 7.
Figure 9:
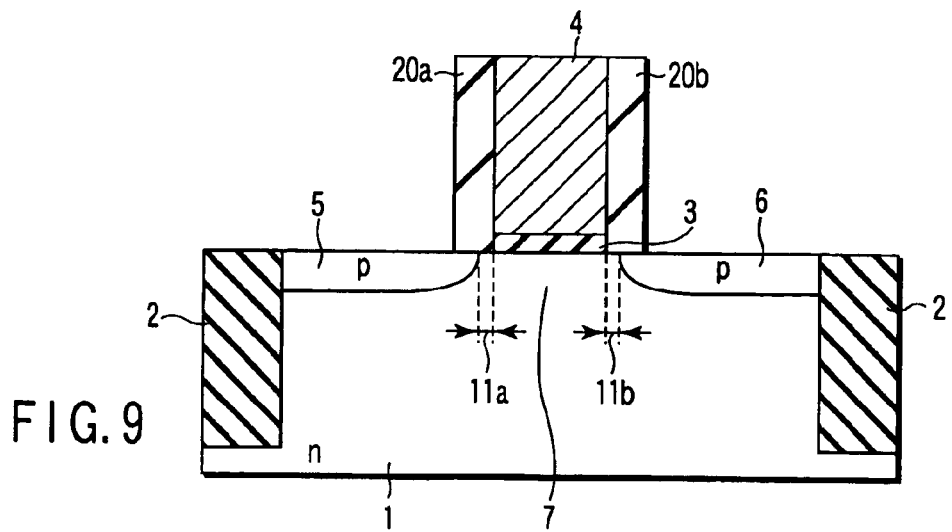
FIG. 9 is a cross-sectional view illustrating a manufacturing step performed subsequent to the step of FIG. 8.

Then, as shown in FIG. 8, by ion implantation, source/drain impurity 21 is introduced into the substrate 1 to form a source region 5 and a drain region 6 as shown in FIG. 9. As for the p-type impurity, it is possible to employ boron, or boron difluoride. When the substrate 1 is p-type, arsenic, antimony, etc. may be introduced therein as an n-type impurity. The offset spacers 20a and 20b to be disposed on the sidewall of the gate electrode 4 are required to have a thickness which is capable of preventing the ion-implanted source/drain impurity 21 from being introduced into an inner region of substrate located immediately below the gate electrode 4.

As shown in FIG. 9, offset gate regions 11a and 11b are disposed between an end portion of the source region 5 or the drain region 6 and the sidewall of the gate electrode 4. The film thickness of the offset spacers 20a and 20b and the conditions of ion implantation 21 are selected so as to enable the length of the offset gate region to have a desired value of 10 nm or less. For example, when BF$_2$ is implanted as the ion-implanted source/drain impurity 21 by using an incident energy of 1.5 keV, the offset spacers 20a and 20b each having a thickness of about 6 to 15 nm can be formed. By using the offset spacers 20a and 20b and gate electrode 4 as a mask, BF$_2$ can be implanted into the semiconductor substrate 1 at a dosage of about 1 to $2 \times 10^{15}$ cm$^{-2}$, thereby making it possible to form the offset gate regions 11a and 11b each having a length of 10 nm or less. The implantation of impurity may be performed by plasma doping, vapor phase diffusion or solid phase diffusion.

In this case, in order to further adjust the threshold voltage and to suppress the effect of short channel, an oblique ion implantation may be performed using, as a mask, the gate electrode 4 and the offset spacers 20a and 20b, thereby permitting so-called halo impurity to be introduced into the channel region 7. Not only the distribution of source/drain impurity, the distribution of channel impurity and the distribution of halo impurity, but also the length of the offset gate regions 11a and 11b gives a strong influence on the threshold voltage of MOSFET as well as on the effect of short channel.

It is possible, through the provision of the offset gate regions 11a and 11b, to reduce the impurity concentration of channel and the halo impurity concentration. In particular, in the case of MOSFET having a gate length of several tens nanometers, it is possible to suppress the deterioration of current driving power that may be caused due to the deterioration of mobility brought about by the impurity of the channel region 7. Namely, it is possible, through the provision of the offset gate regions 11a and 11b, to design the MOSFET so as to optimize the electric characteristics thereof.

Figure 10:
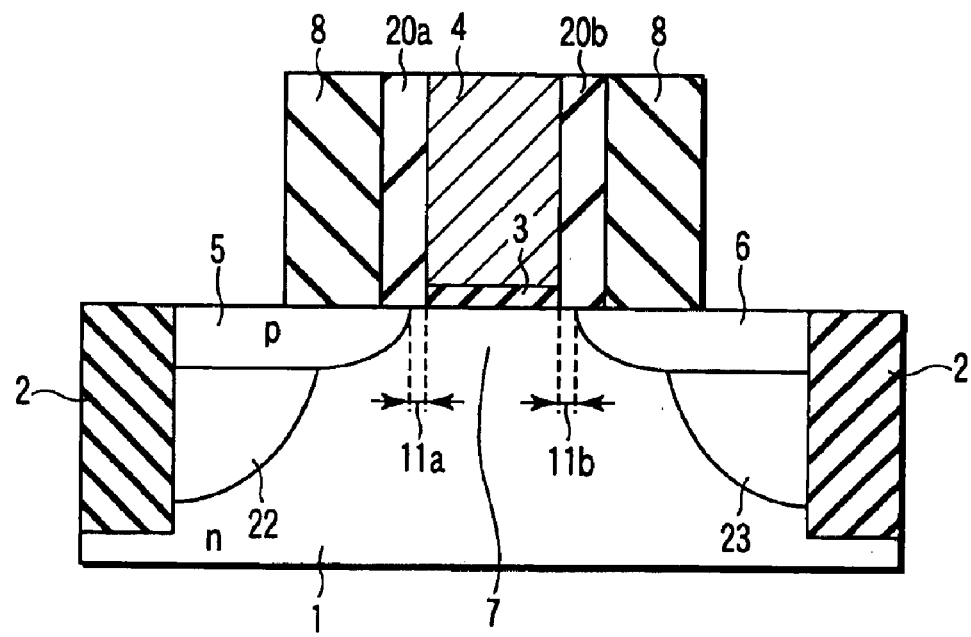
FIG. 10 is a cross-sectional view illustrating a manufacturing step performed subsequent to the step of FIG. 9.

Next, as shown in FIG. 10, by the sidewall-leaving method, the gate sidewall 8 is formed. By using this gate sidewall 8 as a mask, the ion implantation of impurity is performed to form a deep source region 22 and a deep drain region 23. In this case, $BF_2$ can be ion-implanted at 3 keV for instance.

Subsequently, by heat treatment of a very short time, the impurity of source/drain regions is activated without permitting the diffusion of the impurity of source/drain regions, thereby forming source/drain regions of low electric resistance. The duration of this heat treatment should preferably be 100 msec or less. The heat treatment may be performed using electron beam, laser beam having a wavelength in the ultraviolet zone, or flash lamp annealing employing a mercury lamp or xenon lamp at a temperature of 1000° C. or more for a period of 100 msec, more preferably for a period of 10 msec. Such a short time heating can be performed by using, for example, flash lamp annealing. Further, the activation of the impurity to a sufficient degree without substantially causing the diffusion of the impurity can be performed by a method wherein a preliminary heating is performed at a temperature of about 500° C. for instance and then, the surface of wafer is heat-treated by flash lamp annealing for a time as short as 1 msec or so. In this case, a metal silicide layer such as $CoSi_2$ layer and $TiSi_2$ layer can be formed on the surface of the source/drain regions 5 and 6.

Further, instead of performing the activation of the source/drain regions 5 and 6 subsequent to forming the deep source/drain regions, the activation of the source/drain regions 5 and 6 may be preformed after introducing the impurity of the source/drain regions 5 and 6 and before forming the gate sidewall 8.

Since the heat treatment is performed within a very short period of time, the depth of the source region 5 and the drain region 6 after the activation can be limited to 16 nm or less. To suppress the diffusion of impurity, it is preferable not to perform a heat treatment of 700° C. or more in the subsequent processes. By doing so, it is possible to realize a high activation of the source/drain regions and to ensure a channel impurity profile where the impurity concentration of the surface of channel region is limited to a low level.

Figure 11:
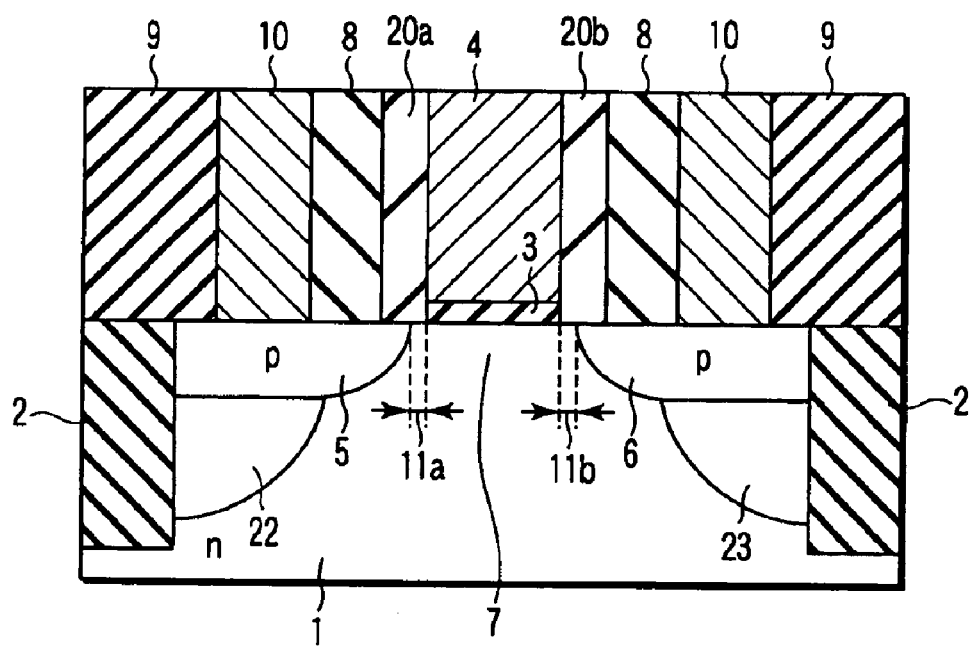
FIG. 11 is a cross-sectional view illustrating a manufacturing step performed subsequent to the step of FIG. 10.

Subsequently, as shown in FIG. 11, an interlayer insulating film 9 is deposited over the entire top surface of substrate, the resultant surface being subsequently flattened by chemical mechanical polishing method (CMP method). By lithography, contact holes are formed in this interlayer insulating film 9 and then, the contact holes are filled with a conductive film to form a wiring 10. In this manner, a MOSFET as a single element is formed. Thereafter, a circuit (not shown) is formed contiguous with a wiring 22, thus forming, together with other elements, an integrated circuit.

As described above, according to this embodiment, the activation of the impurity of the source/drain regions is performed through a heat treatment of a very short period of time, which is performed after introducing the impurity of the source/drain regions into the substrate with the offset spacer being employed as a mask. Since the heat treatment is performed within a very short period of time, the diffusion of the impurity of the source/drain regions can be extremely suppressed. With respect to the impurity of channel region, the diffusion thereof can also be much more suppressed than with the case where the conventional spike annealing is employed. In this case, the channel impurity as well as the halo impurity are enabled to distribute in such a manner that the concentration of impurity of the channel-forming region can be sharply reduced at the top surface of substrate, thereby making it possible to design the impurity distribution so as to suppress the effects of short channel by an inner region of substrate located in the vicinity of the uppermost surface of substrate.

Further, since the source/drain regions are formed through the formation of the offset gate region, the concentration of the channel impurity as well as the concentration of the halo impurity can be limited to a low level. Due to the provision of this sharp channel impurity profile of low impurity concentration, it is possible to enhance the mobility and the current driving power. Further, since the offset gate region is disposed and at the same time, the channel impurity distribution is optimized in this manner, it is now possible to realize an integrated circuit of high performance.

It is now possible, according to the embodiments of the present invention, to obtain a semiconductor device, which is high in speed, low in power consumption and stable in operation, and hence the present invention would be very valuable, from an industrial viewpoint.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a pair of element isolating insulating films separately formed in said semiconductor substrate and defining an element region;
   a pair of impurity diffusion regions formed in said element regions and in contact with said element isolating insulating films, respectively;
   a channel region interposed between said pair of impurity diffusion regions; and
   a gate electrode having a gate length of 30 nm or less and formed via a gate insulating film on said channel region, said gate electrode being disposed away from end portions of said impurity diffusion regions, a distance between said impurity diffusion regions and the edges of said gate electrode being 10 nm or less, and the distribution in lateral direction of impurity concentration in said impurity diffusion regions being 1 digit/3 nm or more.

2. The semiconductor device according to claim 1, wherein a surface portion of said channel region has an impurity concentration of less than $2 \times 10^{18}$ $cm^{-3}$.

3. The semiconductor device according to claim 1, wherein a surface portion of said channel region have an impurity concentration of less than $5 \times 10^{17}$ $cm^{-3}$.

4. The semiconductor device according to claim 1, wherein said impurity diffusion region has a depth of 16 nm or less and a sheet resistance of less than 1 k$\Omega$/□.

5. The semiconductor device according to claim 1, wherein a distribution in lateral direction of impurity concentration in said impurity diffusion regions is 1 digit/2.5 nm or more.

6. The semiconductor device according to claim 1, wherein a distribution in lateral direction of impurity concentration in said impurity diffusion regions is 1 digit/2 nm or more.

7. The semiconductor device according to claim 1, wherein a region of said semiconductor substrate which is located below said gate electrode is substantially free from impurity of said impurity diffusion region.

8. The semiconductor device according to claim 1, wherein said semiconductor substrate is formed of an SOI structure.

9. The semiconductor device according to claim 1, wherein said gate insulating film has a thickness of less than 2 nm when reduced as a silicon oxide film.

10. The semiconductor device according to claim 1, wherein said gate electrode is formed of doped polysilicon.

11. The semiconductor device according to claim 1, wherein said gate electrode is formed of a metal, a metal compound or a laminate comprising a metal or a metal compound.

* * * * *

UNITED STATES PATENT AND TRADEMARK OFFICE
CERTIFICATE OF CORRECTION

PATENT NO. : 6,911,705 B2  
DATED : June 28, 2005  
INVENTOR(S) : Nishinohara

It is certified that error appears in the above-identified patent and that said Letters Patent is hereby corrected as shown below:

<u>Column 10,</u>  
Line 59, change "have" to -- has --.

Signed and Sealed this

Eleventh Day of October, 2005

JON W. DUDAS  
*Director of the United States Patent and Trademark Office*